United States Patent
Hsu et al.

(10) Patent No.: US 9,000,544 B2
(45) Date of Patent: Apr. 7, 2015

(54) MEMS PACKAGE STRUCTURE

(71) Applicant: PixArt Imaging Inc., Hsinchu (TW)

(72) Inventors: Hsin-Hui Hsu, Hsinchu (TW);
Sheng-Ta Lee, Hsinchu (TW);
Chuan-Wei Wang, Hsinchu (TW)

(73) Assignee: Pixart Imaging Inc., Hsinchu (TW)

( * ) Notice: Subject to any disclaimer, the term of this patent is extended or adjusted under 35 U.S.C. 154(b) by 0 days.

(21) Appl. No.: 14/449,583

(22) Filed: Aug. 1, 2014

(65) Prior Publication Data

US 2014/0339655 A1    Nov. 20, 2014

Related U.S. Application Data

(63) Continuation of application No. 13/535,682, filed on Jun. 28, 2012, now Pat. No. 8,829,628, which is a continuation of application No. 12/837,922, filed on Jul. 16, 2010, now Pat. No. 8,247,253.

(30) Foreign Application Priority Data

Aug. 11, 2009 (TW) .............................. 98126961 A
Apr. 2, 2010 (TW) .............................. 99110406 A

(51) Int. Cl.
*H01L 23/28* (2006.01)
*B81B 7/00* (2006.01)
*B81C 1/00* (2006.01)

(52) U.S. Cl.
CPC .......... *B81B 7/0058* (2013.01); *B81C 1/00246* (2013.01); *B81C 1/00293* (2013.01); *B81C 2203/0136* (2013.01); *B81C 2203/0145* (2013.01); *B81C 2203/0714* (2013.01);

(Continued)

(58) Field of Classification Search
CPC ........................... B81B 7/0051; B81C 1/0019
USPC ................. 438/51, 52, 53, 124; 257/415, 704
See application file for complete search history.

(56) References Cited

U.S. PATENT DOCUMENTS

| 5,313,089 A | 5/1994 | Jones, Jr. |
| 5,578,523 A | 11/1996 | Fiordalice et al. |
| 5,760,455 A | 6/1998 | Hierold et al. |

(Continued)

FOREIGN PATENT DOCUMENTS

| CN | 1521847 | 8/2004 |
| CN | 1581438 | 2/2005 |

(Continued)

*Primary Examiner* — George Fourson, III
(74) *Attorney, Agent, or Firm* — WPAT, PC; Justin King

(57) ABSTRACT

A MEMS package structure, including a substrate, an interconnecting structure, an upper metallic layer, a deposition element and a packaging element is provided. The interconnecting structure is disposed on the substrate. The MEMS structure is disposed on the substrate and within a first cavity. The upper metallic layer is disposed above the MEMS structure and the interconnecting structure, so as to form a second cavity located between the upper metallic layer and the interconnecting structure and communicates with the first cavity. The upper metallic layer has at least a first opening located above the interconnecting structure and at least a second opening located above the MEMS structure. Area of the first opening is greater than that of the second opening. The deposition element is disposed above the upper metallic layer to seal the second opening. The packaging element is disposed above the upper metallic layer to seal the first opening.

10 Claims, 11 Drawing Sheets

(52) U.S. Cl.
CPC ....... *B81C2203/0735* (2013.01); *B81B 7/0006* (2013.01); *B81B 2201/0264* (2013.01)

(56) References Cited

U.S. PATENT DOCUMENTS

| | | | |
|---|---|---|---|
| 5,798,283 A | 8/1998 | Montague et al. | |
| 6,238,580 B1 | 5/2001 | Cole et al. | |
| 6,546,798 B1 | 4/2003 | Waters et al. | |
| 6,550,330 B1 | 4/2003 | Waters et al. | |
| 6,581,465 B1 | 6/2003 | Waters et al. | |
| 6,636,653 B2 | 10/2003 | Miracky et al. | |
| 6,707,593 B2 | 3/2004 | Le et al. | |
| 6,808,954 B2 | 10/2004 | Ma et al. | |
| 6,822,304 B1 | 11/2004 | Honer | |
| 6,861,633 B2 | 3/2005 | Osborn | |
| 6,936,494 B2 | 8/2005 | Cheung | |
| 6,937,778 B2 | 8/2005 | Winfield et al. | |
| 6,949,866 B2 | 9/2005 | Miller et al. | |
| 7,153,720 B2 | 12/2006 | Augusto | |
| 7,258,012 B2 | 8/2007 | Xie | |
| 7,402,449 B2 | 7/2008 | Fukuda et al. | |
| 7,417,307 B2 | 8/2008 | Haluzak et al. | |
| 7,723,141 B2 | 5/2010 | Robert | |
| 8,062,497 B2 | 11/2011 | Witvrouw et al. | |
| 8,212,351 B1 * | 7/2012 | Debar et al. | 257/704 |
| 2002/0001778 A1 | 1/2002 | Latchford et al. | |
| 2002/0175284 A1 | 11/2002 | Vilain | |
| 2005/0067688 A1 * | 3/2005 | Humpston | 257/704 |
| 2005/0179099 A1 | 8/2005 | Lutz et al. | |
| 2006/0144143 A1 * | 7/2006 | Gogoi et al. | 73/504.12 |
| 2006/0205106 A1 | 9/2006 | Fukuda et al. | |
| 2006/0258039 A1 | 11/2006 | Lutz et al. | |
| 2007/0004096 A1 | 1/2007 | Heuvelman | |
| 2007/0190680 A1 | 8/2007 | Fukuda et al. | |
| 2007/0269920 A1 | 11/2007 | Yu et al. | |
| 2008/0188025 A1 * | 8/2008 | Nakamura | 438/51 |
| 2009/0075415 A1 | 3/2009 | Nakamura | |
| 2010/0181631 A1 | 7/2010 | Lacey | |
| 2011/0037132 A1 | 2/2011 | Hsu et al. | |
| 2011/0079081 A1 | 4/2011 | Weiss et al. | |
| 2011/0165718 A1 | 7/2011 | Lutz | |
| 2011/0227176 A1 | 9/2011 | Wang | |
| 2012/0276677 A1 * | 11/2012 | Yang | 438/64 |
| 2013/0285162 A1 | 10/2013 | Lutz et al. | |
| 2014/0183735 A1 * | 7/2014 | Zhang et al. | 257/741 |
| 2014/0203379 A1 * | 7/2014 | Teh et al. | 257/415 |

FOREIGN PATENT DOCUMENTS

| | | |
|---|---|---|
| CN | 1898150 | 1/2007 |
| CN | 1914115 | 2/2007 |
| CN | 101217185 | 7/2008 |

* cited by examiner

MEMS PACKAGE STRUCTURE

CROSS-REFERENCE TO RELATED APPLICATION

This application is a continuation application of U.S. patent application Ser. No. 13/535,682 FILED ON JUN. 28, 2012, wherein U.S. patent application Ser. No. 13/535,682 is a continuation application of U.S. patent application Ser. No. 12/837,922 FILED ON JUL. 16, 2010.

BACKGROUND

1. Technical Field

The present invention relates to a MEMS package structure, and more particularly to a MEMS package structure with low production cost and high process yield.

2. Description of the Related Art

Micro Electro-Mechanical System (MEMS) technique has developed a whole new technical field and industry. The MEMS technique has been widely used in a variety of microelectronic devices, such as pressure sensors, accelerators and micro-microphones, which have electronic and mechanical properties.

Because the MEMS components usually run sensitively, the clean request of the running environment of the MEMS components is high. Accordingly, in order to avoid external contaminants entering the running environment of the MEMS components to degrade performances of the MEMS components, the MEMS components should be sealed in the running environment thereof by a packaging process after the MEMS components are fabricated. Therefore, the packaging process may have a great impact on the performance of the MEMS components.

BRIEF SUMMARY

The present invention relates to a MEMS package structure, in which a MEMS structure can be hermetically and effectively packaged.

The present invention provides a MEMS package structure, which includes a substrate, an interconnecting structure, an upper metallic layer, a deposition element and a packaging element. The interconnecting structure is disposed on the substrate. The MEMS structure is disposed on the substrate and within a first cavity. The upper metallic layer is disposed above the MEMS structure and the interconnecting structure, so as to form a second cavity located between the upper metallic layer and the interconnecting structure. The second cavity communicates with the first cavity. The upper metallic layer has at least a first opening and at least a second opening. The first opening is located above the interconnecting structure. The second opening is located above the MEMS structure. Area of the first opening is greater than that of the second opening. The deposition element is disposed above the upper metallic layer to seal the second opening. The packaging element is disposed above the upper metallic layer to seal the first opening.

The present invention also provides a MEMS package structure, which includes a substrate, an interconnecting structure, a buffering element, a supporting layer and a packaging layer. The interconnecting structure is disposed on the substrate and has a third cavity. The buffering element is partially disposed within the third cavity. The supporting layer is partially suspended above the third cavity. The supporting layer has a fifth opening defined above the third cavity and exposing a portion of the buffering element. The packaging layer is disposed on the supporting layer and fills into the fifth opening to connect with the buffering element.

In the fabricating process of the MEMS package structure of the present invention, the non-gastight channel is remained above the interconnecting structure in the vacuum environment, and then the MEMS structure are completely sealed in the atmospheric pressure environment. Therefore, when the MEMS structure is moved from the vacuum environment to the atmospheric pressure environment, the layers above the MEMS region would not collapse due to the differential pressure. Furthermore, the method for fabricating MEMS package structure of the present invention can be performed in the low temperature environment, thus it can prevent the MEMS package structure from damaging in the high temperature environment.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1A:
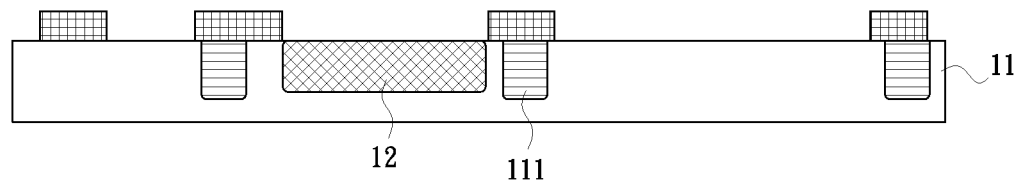
FIGS. 1A to 1E are cross-sectional, schematic views of a MEMS package structure according to an embodiment of the present invention, when the MEMS package structure is fabricated.

FIGS. 1A to 1E are cross-sectional, schematic views of a MEMS package structure according to an embodiment of the present invention, when the MEMS package structure is fabricated. Referring to FIG. 1A, firstly, a substrate 11 is provided. The substrate 11 can be a silicon substrate or a substrate of silicon on insulator (SOI). In the embodiment, one or more semi-conductor elements 12 can be formed in the substrate 11. If there are a plurality of semi-conductor elements 12 formed in the substrate 11, the semi-conductor elements 12 can be interval by shallow trench insulation (STI) 111 therebetween.

Figure 1B:
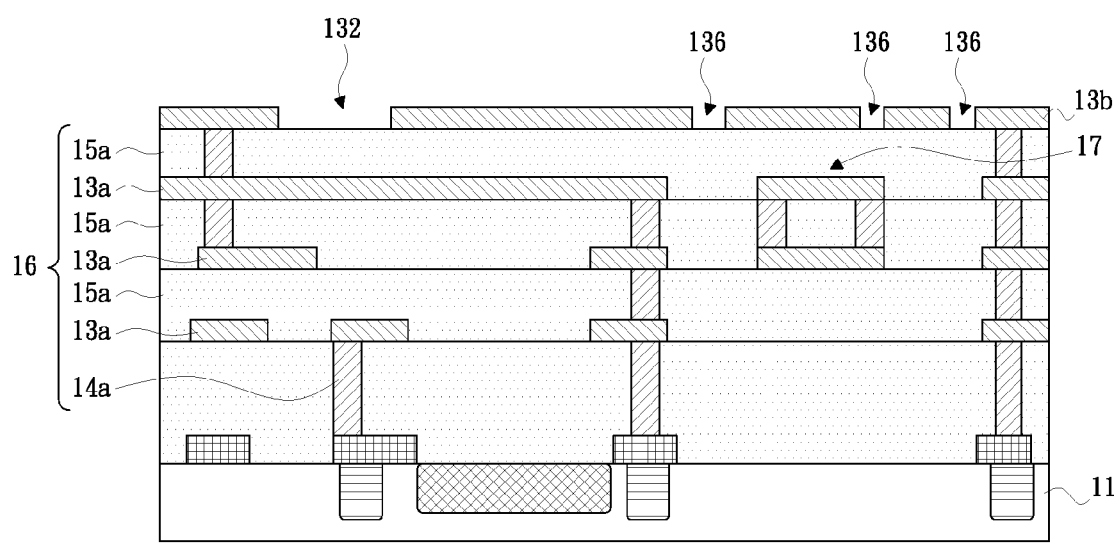

Next, referring to FIG. 1B, a plurality of lower metallic layers 13a, a plurality of first contact windows 14a and a plurality of first oxide layers 15a are formed on the substrate 11. The lower metallic layers 13a and the first oxide layers 15a are interlaced with each other. The first contact windows 14a are located in the first oxide layers 15a and connect with the lower metallic layers 13a correspondingly. The lower metallic layers 13a, the first contact windows 14a and the first oxide layers 15a compose an interconnecting structure 16 and a MEMS structure 17 on the substrate 11. Next, an upper metallic layer 13b is formed above the interconnecting structure 16 and the MEMS structure 17. The upper metallic layer 13b has at least one first opening 132 and at least one second opening 136. The first opening 132 is located above the interconnecting structure 16. The second openings 136 are located above the MEMS structure 17. The first opening 132 and the second openings 136 respectively expose a portion of the first oxide layers 15a. Area of the first opening 132 is greater than that of each second opening 136. Material of the lower metallic layers 13a or the upper metallic layer 13b can be aluminum, and material of the first contact windows 14a can be tungsten, and material of the first oxide layers 15a can be silicon oxide or other oxides.

Figure 1C:
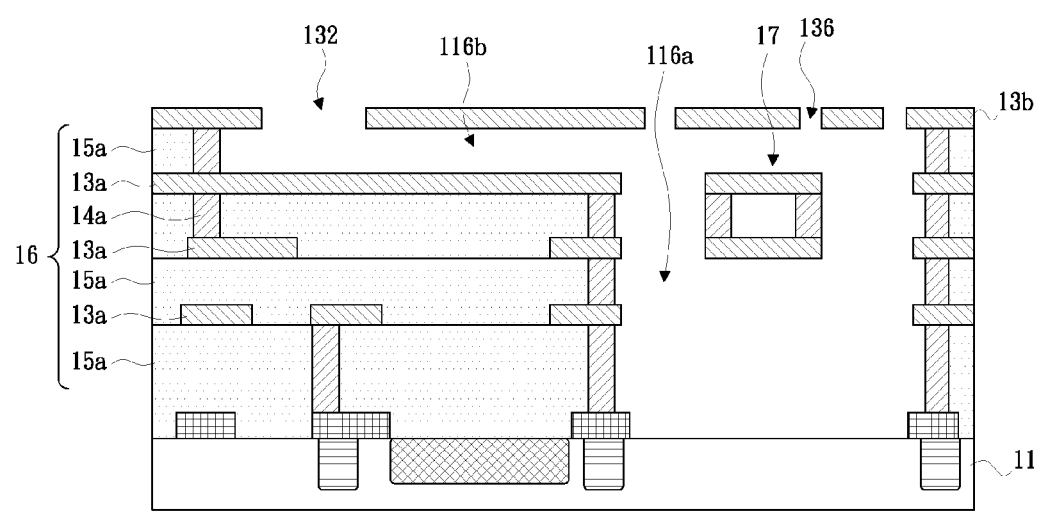

Next, referring to FIG. 1C, a portion of the first oxide layers 15a is removed to form a first cavity 116a and a second cavity 116b. The first cavity 116a surrounds the MEMS structure 17. The second cavity 116b is located above the interconnecting structure 16. The first cavity 116a communicates with the second cavity 116b. In the embodiment, the portion of the first oxide layers 15a can be removed by applying the second openings 136 as an etching channel to perform an etching process by vapor of hydrofluoric acid. In an alternative embodiment, the portion of the first oxide layers 15a can be removed by applying the first opening 132 and the second openings 136 as etching channels simultaneously, so as to increase etching rate.

Figure 1D:
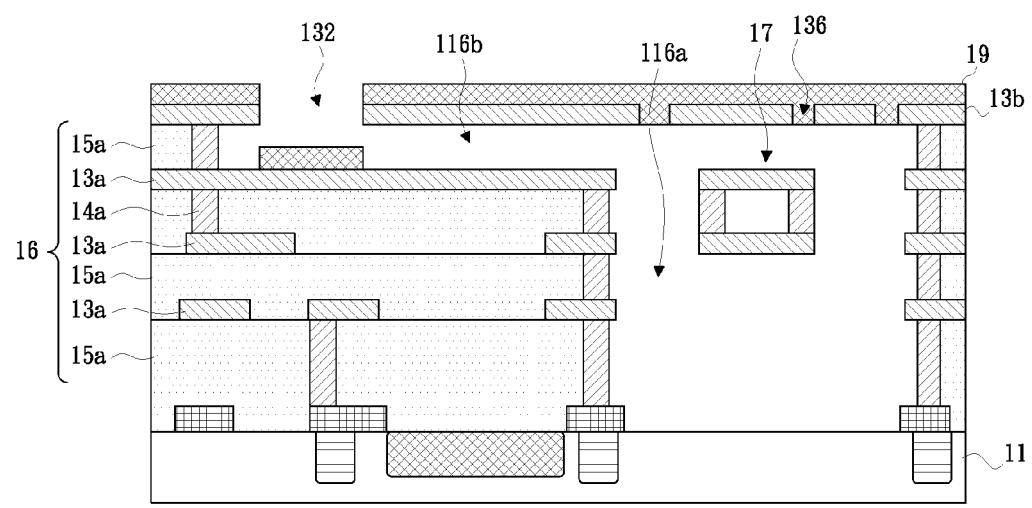

Next, referring to FIG. 1D, after the portion of the first oxide layers 15a is removed, a deposition element that is the packaging layer 19 can be formed above the upper metallic layer 13b and fills into the second openings 136 in a vacuum environment. As such, the external contaminants would not enter the first cavity 116a through the second openings 136 to damage the MEMS structure 17. An aspect ratio of the second cavity 116b is configured suitable for making the packaging layer 19 opened above the first opening 132, therefore after the packaging layer 19 is formed, the first cavity 116a can communicate with the first opening 132 via the second cavity 116b. In other words, the first cavity 116a is not hermetic. Consequently, if the semi-finished product of FIG. 1D is moved to the normal pressures environment from the vacuum environment after the packaging layer 19 is formed, there is not a differential pressure between the first cavity 116a and an exterior of the semi-finished product, and thus the packaging layer 19 would not collapse due to differential pressure. Accordingly, process yield can be easily increased.

Figure 1E:
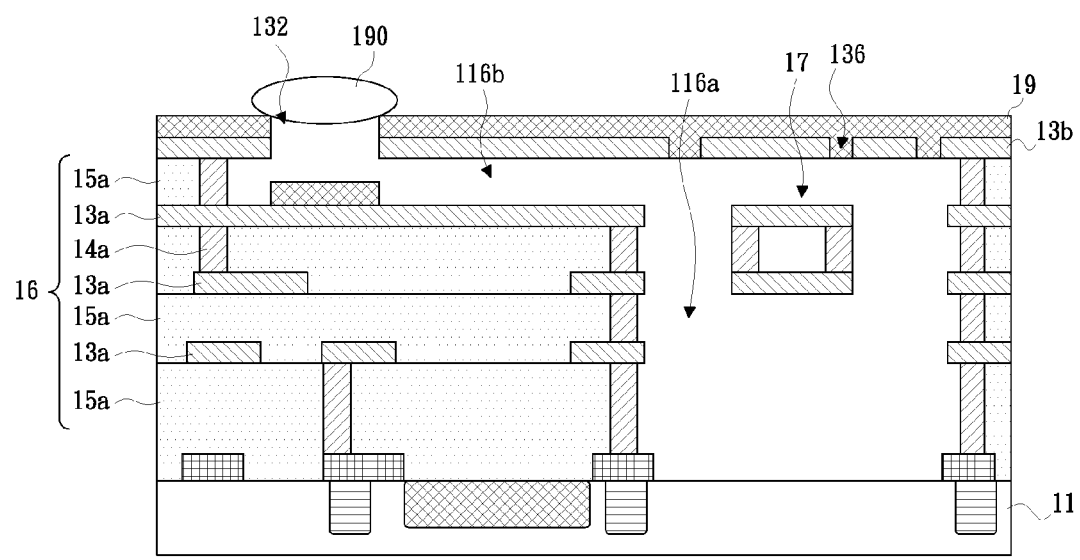

Next, referring to FIG. 1E, after the packaging layer 19 is formed, a packaging element 190 is formed above the upper metallic layer 13b in a non-vacuum environment to seal the first opening 132. As such, the moisture or the dust would not enter the first cavity 116a via the first opening 132 and the second openings 136 to damage the MEMS structure 17. It should be noted that, the packaging element 190 can be formed in a wire bonding process.

In the embodiment, the first cavity 116a can communicate with the first opening 132 via the second cavity 116b before forming the packaging element 190, and the packaging element 190 is formed in the non-vacuum environment. Therefore the packaging layer 19 and the upper metallic layer 13b would not collapse due to the differential pressure. And thus the process yield can be easily increased.

Figure 2A:
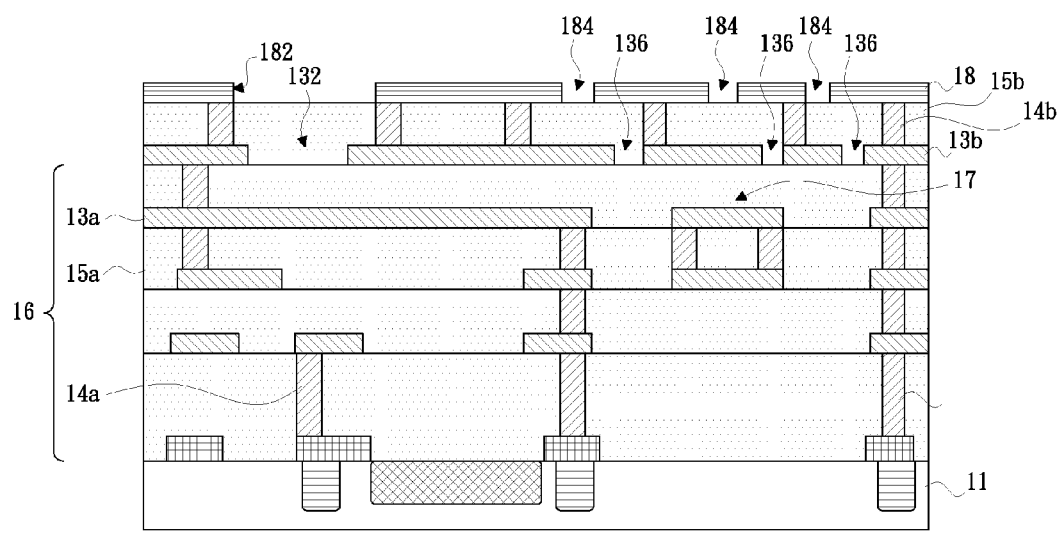
FIGS. 2A to 2C are cross-sectional, schematic views of a MEMS package structure according to another embodiment of the present invention, when the MEMS package structure is fabricated.

In addition, in anther embodiment, before the packaging layer 19 is formed, a second oxide layer 15b and a mask layer 18 can be formed on the upper metallic layer 13b in sequence, as shown in FIG. 2A. The second oxide layer 15b can have a plurality of second contact windows 14b therein. The mask layer 18 can have at least one third opening 182 and at least one fourth opening 184. The third opening 182 is located above the first opening 132. The fourth openings 184 are located above the MEMS structure 17. In the embodiment, the fourth openings 184 and the second openings 136 are staggered with each other.

Figure 2B:
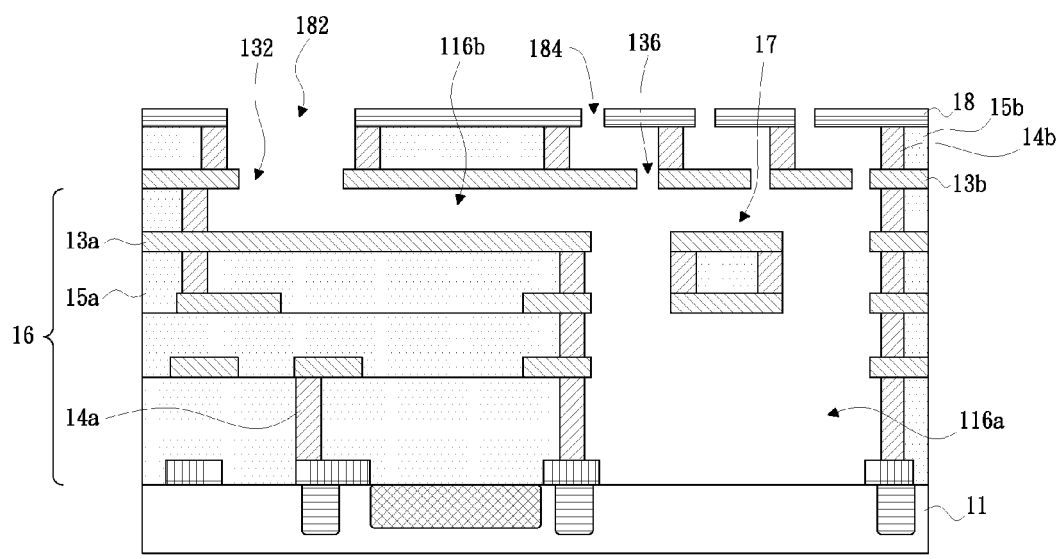

Next, referring to FIG. 2B, the third opening 182 and the fourth openings 184 are employed as etching channels to remove a portion of the second oxide layer 15b, so as to expose the first opening 132 and the second opening 136. Subsequently, the portion of the first oxide layer 15a is removed to form the first cavity 116a and the second cavity 116b using a method the same or similar to that of the above embodiments.

Figure 2C:
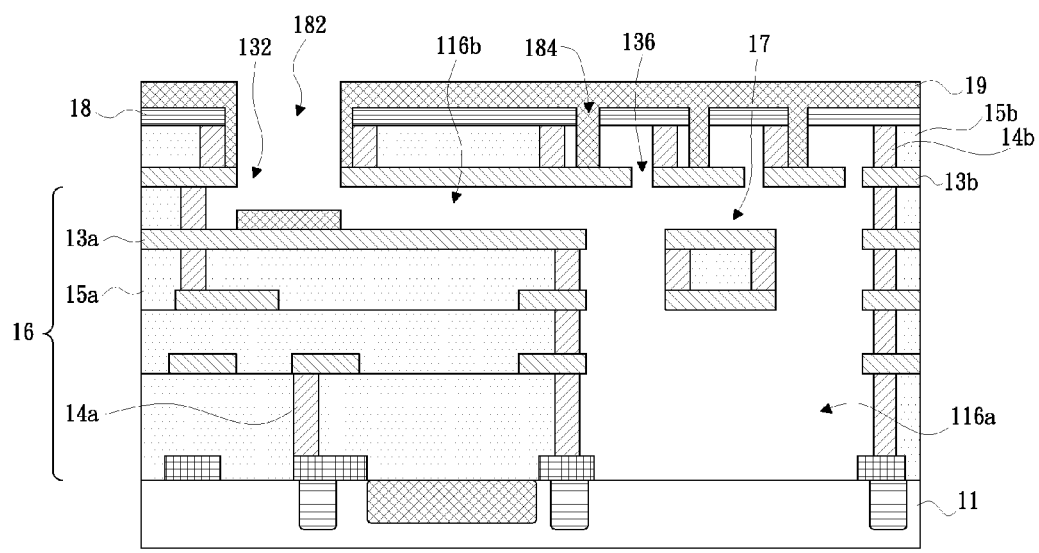

In the embodiment, a diameter of the third opening 182 of the mask layer 18 is greater than that of the first opening 132 of the upper metallic layer 13b. Therefore, as shown in FIG. 2C, a portion of the metallic material for forming the packaging layer 19 may deposited on the upper metallic layer 13b exposed by the third opening 182, another portion of the metallic material may be deposited on the interconnecting structure 16 via the first opening 132 of the upper metallic layer 13b. As can be seen, if the second cavity 116b has a suitable aspect ratio, the third opening 182 and the first opening 132 would not be covered by the packaging layer 19. It should be noted that, if the first cavity 116a can communicate with the exterior after forming the packaging layer 19, the shapes or sizes of the third opening 182 and the first opening 132 would not be limited herein.

As mentioned above, the embodiments of the present invention can increase the process yield. To be better understood the present invention, application of the MEMS package structures of the embodiments would be described as follows.

Figure 3:
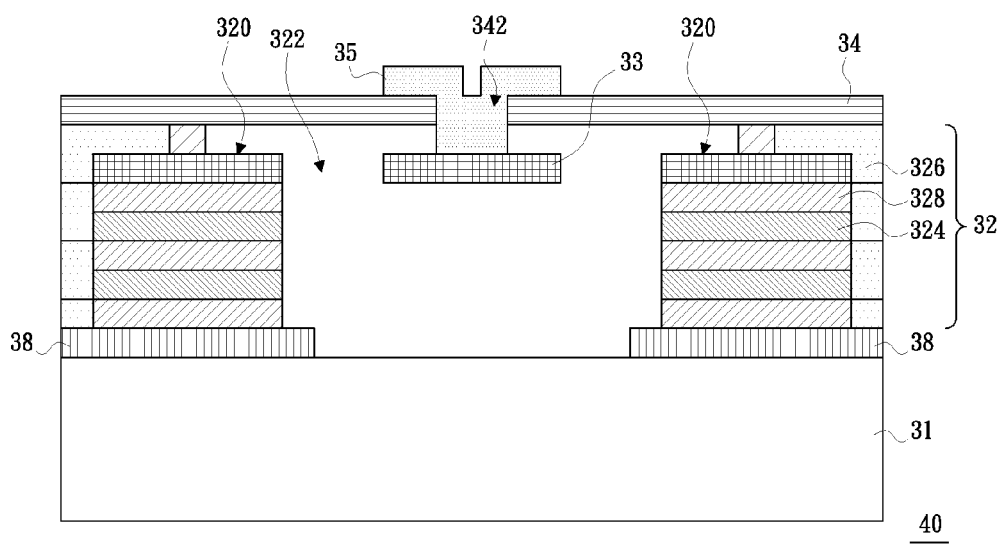
FIG. 3 is a partial, cross-sectional, schematic view of a MEMS package structure according to another embodiment of the present invention.

FIG. 3 is a partial, cross-sectional, schematic view of a MEMS package structure according to another embodiment of the present invention. Referring to FIG. 3, the MEMS package structure 40 can be a package structure of a MEMS pressure sensor. The MEMS package structure 40 includes a substrate 31, an interconnecting structure 32, a buffering element 33, a supporting layer 34 and a packaging layer 35. The interconnecting structure 32 is disposed on the substrate 31, and has a third cavity 322. In details, the interconnecting structure 32 can includes a plurality of metallic layers 324, a plurality of oxide layers 326 and a plurality of contact windows 328. The metallic layers 324 and the oxide layers 326 are interlaced with each other. The contact windows 328 are formed in the oxide layers 326. A portion of the metallic layers 324, the contact windows 328 and the oxide layers 326 on the substrate 31 compose an insulating structure 320 to surround the third cavity 322. Material of the metallic layers 324 can be aluminum, and material of the contact windows 328 can be tungsten. Specially, the MEMS package structure 40 can further includes a non-doped polysilicon layer 38. The non-doped polysilicon layer 38 is disposed between the insulating structure 320 and the substrate 31.

The buffering element 33 is partially disposed in the third cavity 322. Material of buffering element 33 can be aluminum. In the embodiment, the buffering element 33 can be formed together with the interconnecting structure 32. The supporting layer 34 is partially suspended above the third cavity 322, and has a fifth opening 342. The fifth opening 342 is defined above the third cavity 322 and exposes a portion of the buffering element 33. In the embodiment, the packaging layer 35 can be formed by a low temperature process. As such, it can prevent the MEMS package structure 40 from damaging in the high temperature environment. Therefore, the MEMS package structure 40 can increase the process yield and have improved quality. In details, the packaging layer 35 can be deposited to form at a temperature that is less than 350° C. Preferably, the packaging layer 35 can be deposited to form at the temperature in a range from 50° C. to 100° C. Material of the packaging layer 35 can be metal or other material, such as aluminum.

The supporting layer 34 can be connected with the buffering element 33 by the packaging layer 35. Therefore, if the supporting layer 34 is bent towards the third cavity 322 by an external force, the buffering element 33 would provide a supporting force. As such, the supporting layer 34 can be prevented from damaging due to excessive bending.

The package structure of the MEMS pressure sensor is described in the above embodiment, and the present invention is not limited herein. The following would take a package structure of an inertial sensor as an example to describe the present invention.

Figure 4:
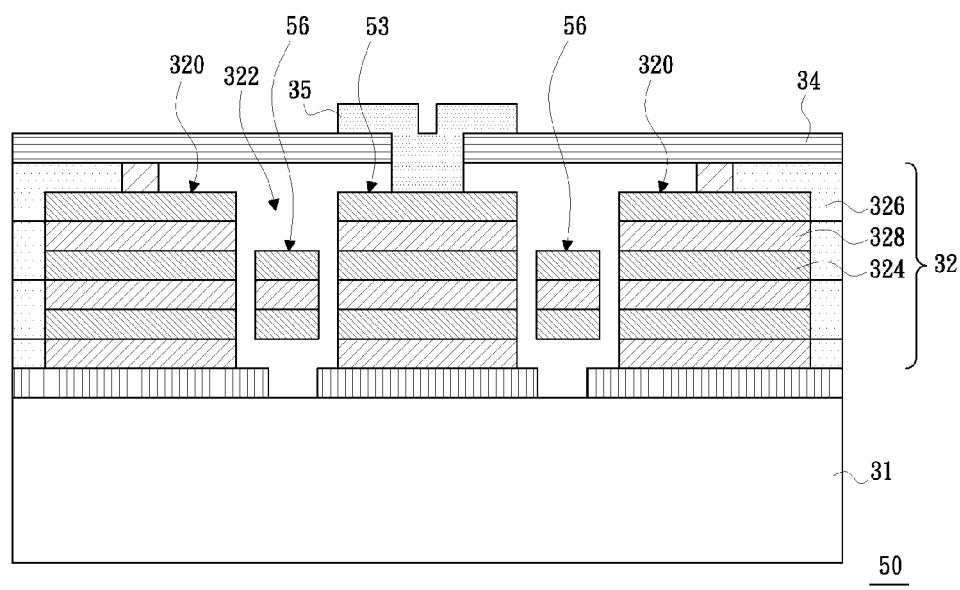
FIG. 4 is a partial, cross-sectional, schematic view of a MEMS package structure according to another embodiment of the present invention.

FIG. 4 is a partial, cross-sectional, schematic view of a MEMS package structure according to another embodiment of the present invention. Referring to FIG. 4, the MEMS package structure 50 can be a package structure of an inertial sensor. The package structure 50 is similar in principle to the package structure 40, and the difference between the package structure 50 and the package structure 40 lies in that a portion of a buffering element 53 disposed in a third cavity 322 is connected with a substrate 31. In details, the buffering element 53 and an interconnecting structure 32 can be formed in the same process, and the buffering element 53 is composed of a plurality layers on the substrate 31. In addition, the MEMS package structure 50 further includes at least one movable element 56. Each movable element 56 is partially disposed in the third cavity 322 and suspended above the substrate 31. In details, a portion of each movable element 56 in the third cavity 322 can move up and down in the third cavity 322.

In the embodiment, the supporting layer 34 is partially suspended above the third cavity 322, and the supporting layer 34 is connected with the buffering element 53 by the packaging layer 35, and the buffering element 53 is fixed on the substrate 31. Therefore, if the supporting layer 34 is bent towards the third cavity 322 by an external force, the buffering element 53 would provide a supporting force. As such, the supporting layer 34 can be prevented from damaging due to excessive bending, and range of movement of the movable elements 56 would not be affected.

Figure 5:
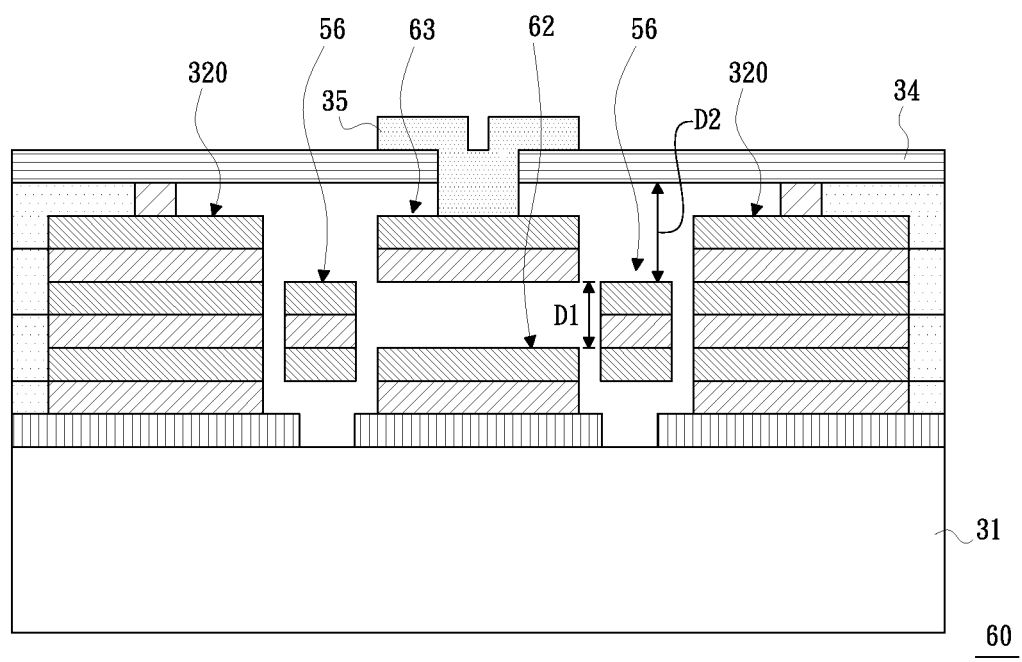
FIG. 5 is a partial, cross-sectional, schematic view of a MEMS package structure according to another embodiment of the present invention.

In the above embodiment, the buffering element 53 is directly connected with the substrate 31, and the present invention is not limited herein. In other embodiments, a buffering element 63 can be suspended above the substrate 31. Referring to FIG. 5, a MEMS package structure further includes a stopping element 62. The stopping element 62 is disposed between the substrate 31 and the buffering element 63. The stopping element 62 and the buffering element 63 define a first interval D1 therebetween. The movable element 56 and the supporting layer 34 define a second interval D2 therebetween. To avoid bending of the supporting layer 34 affecting the range of movement of the movable elements 56 due to the external force, a size of the first interval D1 can be less than that of the second interval D2. As such, when the supporting layer 34 is bent due to the external force, the buffering element 63 would resist against the stopping element 62, and thus the movable element 56 can move normally.

In summary, the MEMS structure can be packaged by a CMOS process, so the fabricating procedure of the MEMS package structure can be reduced, and thus the production cost of the microelectronic device can be reduced and the process yield can be increased. Furthermore, the method for fabricating MEMS package structure of the present invention can be performed in the low temperature environment, thus it can prevent the MEMS package structure from damaging in the high temperature environment.

In addition, in the method for fabricating MEMS package structure of the present invention, the non-gastight channel is remained above the interconnecting structure in the vacuum environment, and then the MEMS structure are completely sealed in the atmospheric pressure environment. Therefore, when the MEMS structure is moved from the vacuum environment to the atmospheric pressure environment, the layers above the MEMS region would not collapse due to the differential pressure.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A MEMS package structure, comprising:
   a substrate;
   an interconnecting structure disposed on the substrate and having a third cavity;
   a buffering element partially disposed within the third cavity;
   a supporting layer partially suspended above the third cavity, the supporting layer having a fifth opening defined above the third cavity and exposing a portion of the buffering element; and
   a packaging layer disposed on the supporting layer and filling into the fifth opening to connect with the buffering element.

2. The MEMS package structure as claimed in claim 1, wherein material of the packaging layer comprises metal.

3. The MEMS package structure as claimed in claim 1, wherein material of the packaging layer comprises aluminum.

4. The MEMS package structure as claimed in claim 1, further comprising an insulating structure disposed on the substrate and surrounding the third cavity.

5. The MEMS package structure as claimed in claim 4, further comprising a non-doped polysilicon layer disposed between the insulating structure and the substrate.

6. The MEMS package structure as claimed in claim 1, wherein a portion of the buffering element in the third cavity is connected with the substrate.

7. The MEMS package structure as claimed in claim 1, wherein a portion of the buffering element in the third cavity is suspended above the substrate.

8. The MEMS package structure as claimed in claim 7, further comprising a stopping element disposed between the substrate and the buffering element, the buffering element and the stopping element defining a first interval therebetween.

9. The MEMS package structure as claimed in claim 8, further comprising a movable element partially disposed in the third cavity and suspended above the substrate.

10. The MEMS package structure as claimed in claim 9, wherein the movable element and the supporting layer define a second interval therebetween, and the second interval is greater than the first interval.

* * * * *